US009449981B2

(12) United States Patent
Pachamuthu et al.

(10) Patent No.: US 9,449,981 B2
(45) Date of Patent: Sep. 20, 2016

(54) THREE DIMENSIONAL NAND STRING MEMORY DEVICES AND METHODS OF FABRICATION THEREOF

(71) Applicant: SanDisk Technologies, Inc., Plano, TX (US)

(72) Inventors: Jayavel Pachamuthu, San Jose, CA (US); Johann Alsmeier, San Jose, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/520,084

(22) Filed: Oct. 21, 2014

(65) Prior Publication Data
US 2016/0111434 A1    Apr. 21, 2016

(51) Int. Cl.
H01L 21/336    (2006.01)
H01L 27/115    (2006.01)
(Continued)

(52) U.S. Cl.
CPC ..... H01L 27/11556 (2013.01); H01L 21/0217 (2013.01); H01L 21/02164 (2013.01); H01L 21/02244 (2013.01); H01L 21/02532 (2013.01); H01L 21/02592 (2013.01); H01L 21/02595 (2013.01); H01L 21/02667 (2013.01); H01L 21/02672 (2013.01); H01L 21/28273 (2013.01); H01L 21/28556 (2013.01); H01L 21/28568 (2013.01); H01L 21/31111 (2013.01); H01L 27/1157 (2013.01); H01L 27/11524 (2013.01);
(Continued)

(58) Field of Classification Search
CPC ....... H01L 43/12; H01L 43/02; H01L 43/08; H01L 51/5012; H01L 51/56

USPC .................. 438/264, 268; 257/314
See application file for complete search history.

(56) References Cited

U.S. PATENT DOCUMENTS 5,229,631 A    7/1993    Woo
5,915,167 A    6/1999    Leedy
(Continued)

FOREIGN PATENT DOCUMENTS

WO    WO 2004/061851    7/2004

OTHER PUBLICATIONS

International Searching Authority/European Patent Office, International Searching Report and Written Opinion for PCT/US2010/38130, Nov. 8, 2014.
(Continued)

Primary Examiner — Andy Huynh
(74) Attorney, Agent, or Firm — The Marbury Law Group PLLC

(57) ABSTRACT

A method includes forming an amorphous or polycrystalline semiconductor material over at least a portion of a sidewall of a front side opening and within front side recesses in a stack of alternating first and second material layers, forming a layer of a metal material over at least a portion of the sidewall of the front side opening and adjacent to the semiconductor material within the front side recesses; annealing the metal material and the semiconductor material within the front side recesses to form a large grain polycrystalline or single crystal semiconductor material charge storage region within each of the front side recesses by a metal induced crystallization process, and forming a tunnel dielectric layer and semiconductor channel in the front side opening. Following the metal induced crystallization process, at least a portion of the metal material is located between the charge storage regions and the second material layers.

17 Claims, 13 Drawing Sheets

(51) Int. Cl.
  *H01L 29/423* (2006.01)
  *H01L 29/49* (2006.01)
  *H01L 29/788* (2006.01)
  *H01L 21/311* (2006.01)
  *H01L 21/02* (2006.01)
  *H01L 21/285* (2006.01)
  *H01L 21/28* (2006.01)

(52) U.S. Cl.
  CPC ... *H01L 27/11582* (2013.01); *H01L 29/42328* (2013.01); *H01L 29/42344* (2013.01); *H01L 29/4916* (2013.01); *H01L 29/4966* (2013.01); *H01L 29/7883* (2013.01); *H01L 21/28282* (2013.01)

(56) References Cited

U.S. PATENT DOCUMENTS

| | | |
|---|---|---|
| 6,586,842 B1 | 7/2003 | You et al. |
| 6,881,994 B2 | 4/2005 | Lee et al. |
| 7,955,981 B2 | 6/2011 | Chen et al. |
| 8,349,681 B2 | 1/2013 | Alsmeier et al. |
| 8,592,793 B2 | 11/2013 | Chen et al. |
| 8,658,499 B2 | 2/2014 | Makala et al. |
| 2003/0022420 A1 | 1/2003 | Kleveland et al. |
| 2004/0097035 A1 | 5/2004 | Yamamukai |
| 2005/0052915 A1 | 3/2005 | Herner et al. |
| 2007/0040188 A1 | 2/2007 | Tsai et al. |
| 2007/0217635 A1 | 9/2007 | Ogura et al. |
| 2007/0228414 A1 | 10/2007 | Kumar et al. |
| 2008/0070162 A1 | 3/2008 | Ufert |
| 2008/0099827 A1 | 5/2008 | Kreupl |
| 2008/0217732 A1 | 9/2008 | Kreupl |
| 2009/0230505 A1 | 9/2009 | Dennison |
| 2010/0120214 A1* | 5/2010 | Park ............... H01L 27/11578 438/287 |
| 2010/0155810 A1* | 6/2010 | Kim ............... H01L 27/11548 257/316 |
| 2014/0252452 A1 | 9/2014 | Alsmeier |
| 2016/0043093 A1* | 2/2016 | Lee ............... H01L 27/11521 257/314 |

OTHER PUBLICATIONS

U.S. Appl. No. 13/762,988, filed Feb. 8, 2013, SanDisk Technologies Inc.
U.S. Appl. No. 14/183,152, filed Feb. 18, 2014, SanDisk Technologies Inc.
U.S. Appl. No. 14/190,974, filed Feb. 26, 2014, SanDisk Technologies Inc.
U.S. Appl. No. 14/313,508, filed Jun. 24, 2014, SanDisk Technologies Inc.
U.S. Appl. No. 14/462,156, filed Aug. 18, 2014, SanDisk Technologies Inc.
Endoh et al., "Novel Ultra High Density Memory with a Stacked-Surrounding Gate Transistor (S-SGT) Structured Cell," IEDM Proc. (2001) 33-36.
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 61/977,173, filed Apr. 9, 2014, SanDisk Technologies Inc.
International Search Report and Written Opinion of the International Searching Authority for PCT/US2015/051242, 17 pages, dated Apr. 22, 2016.
Luoh, T. et la., "Improving the Endurance of Nonvolatile Flash Memory Using Micro-Grain Poly-Silicon Floating Gate," IEEE Transactions on Semiconductor Manufaturing, vol. 23, No. 3, pp. 391-399, Aug. 2010.

\* cited by examiner

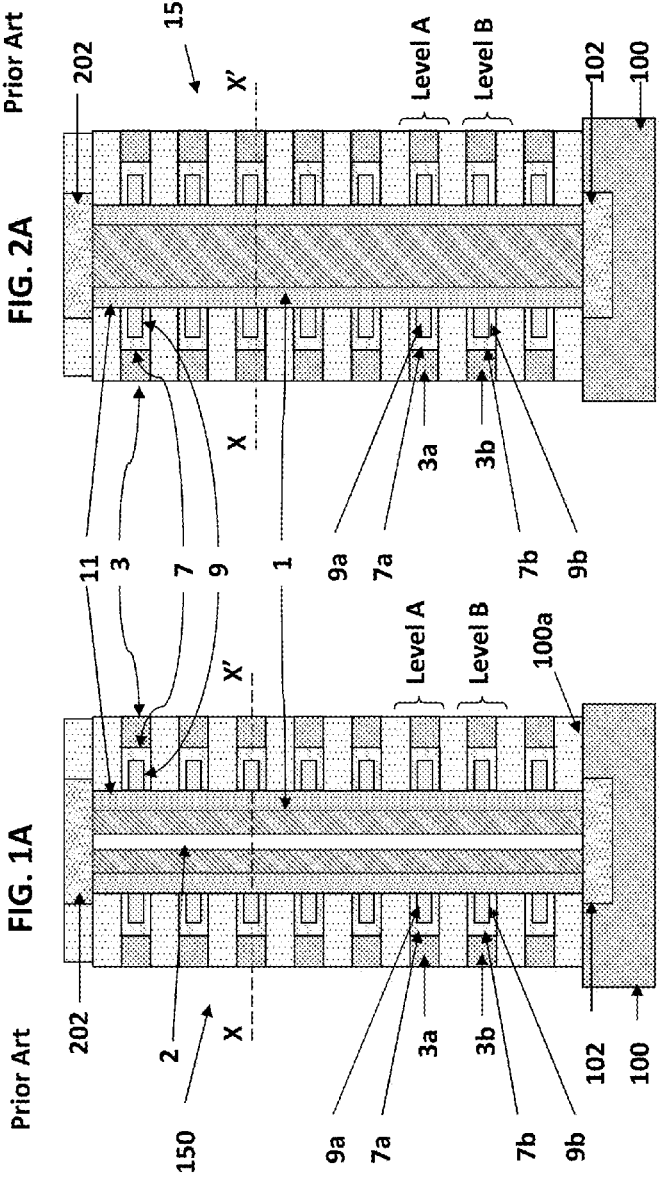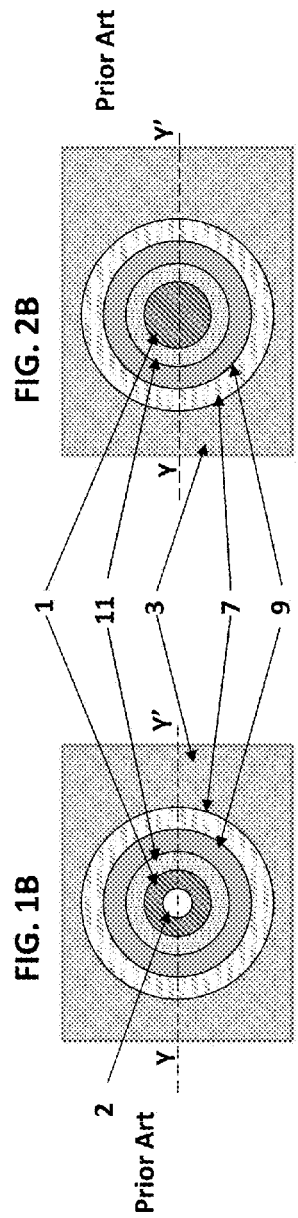

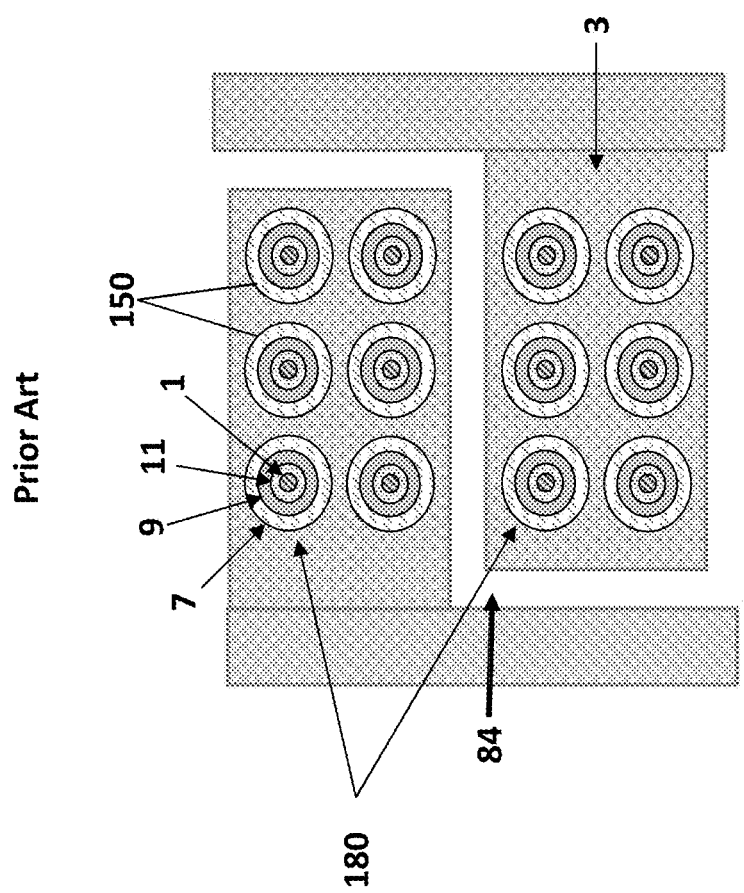

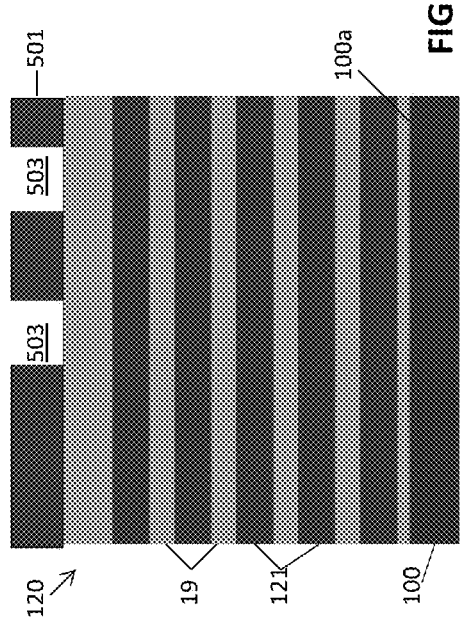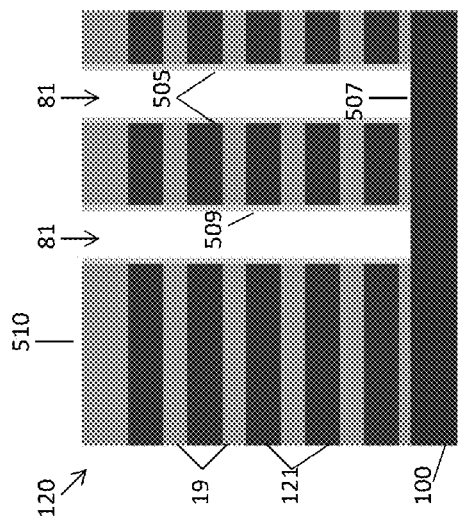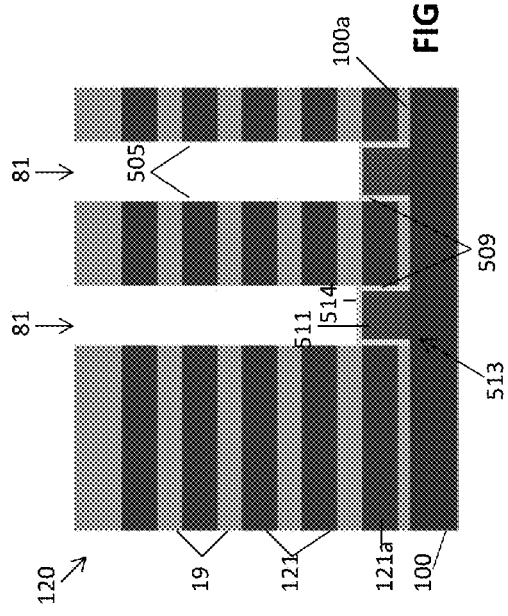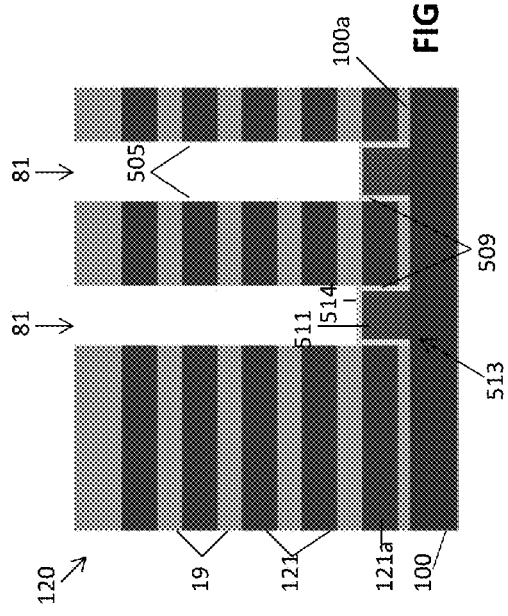

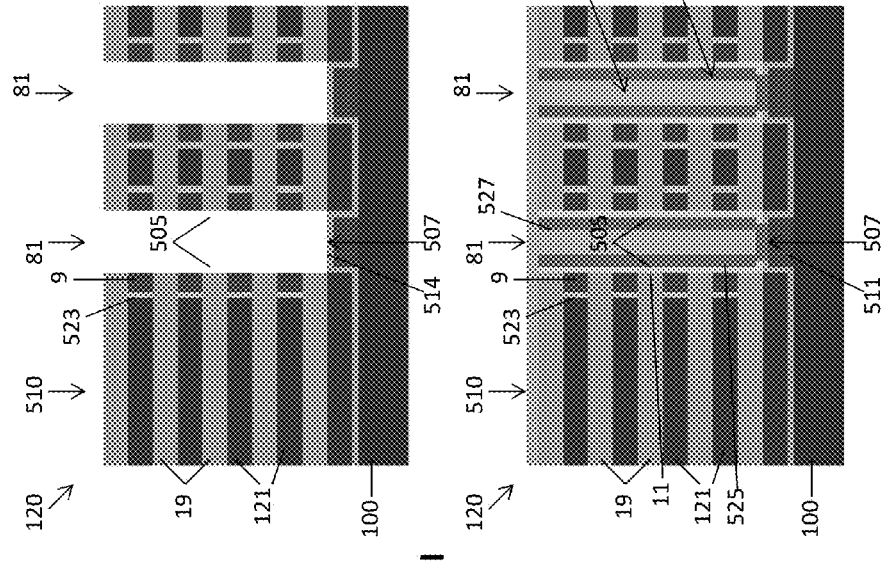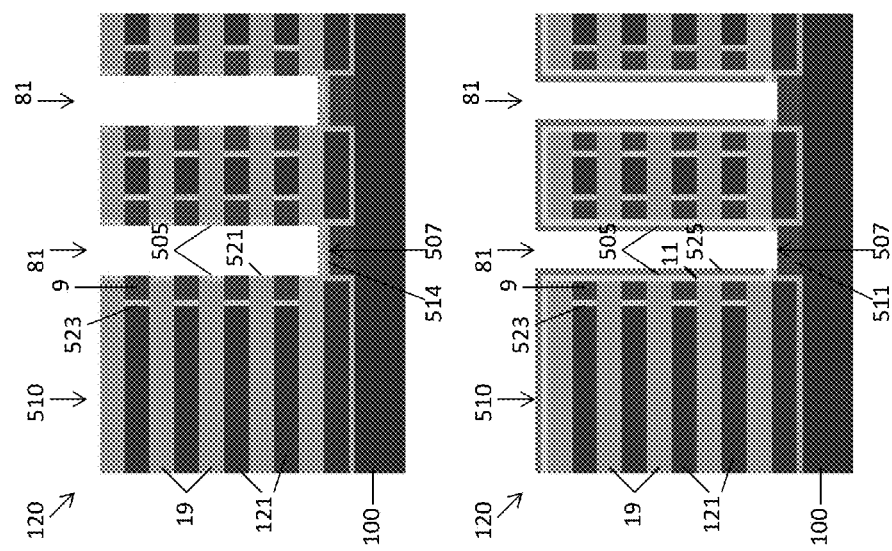

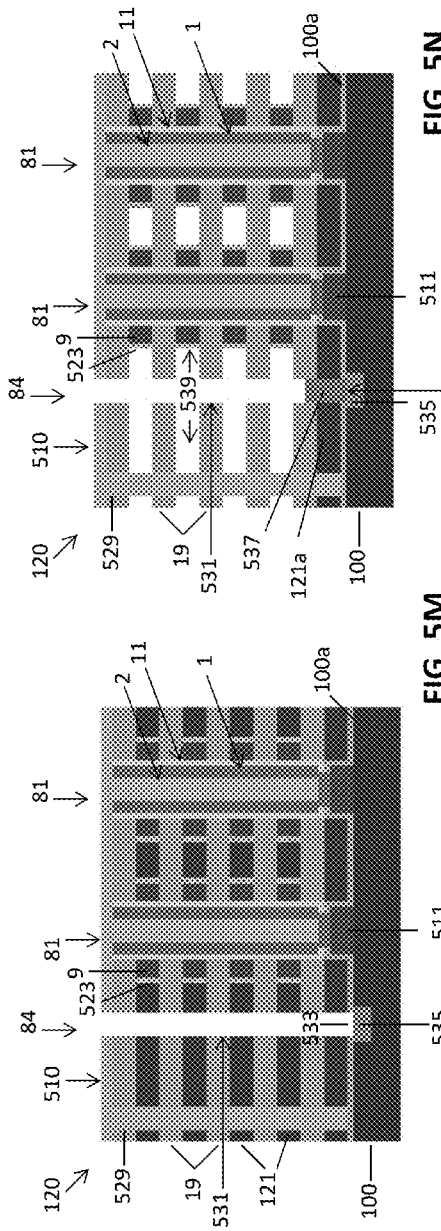
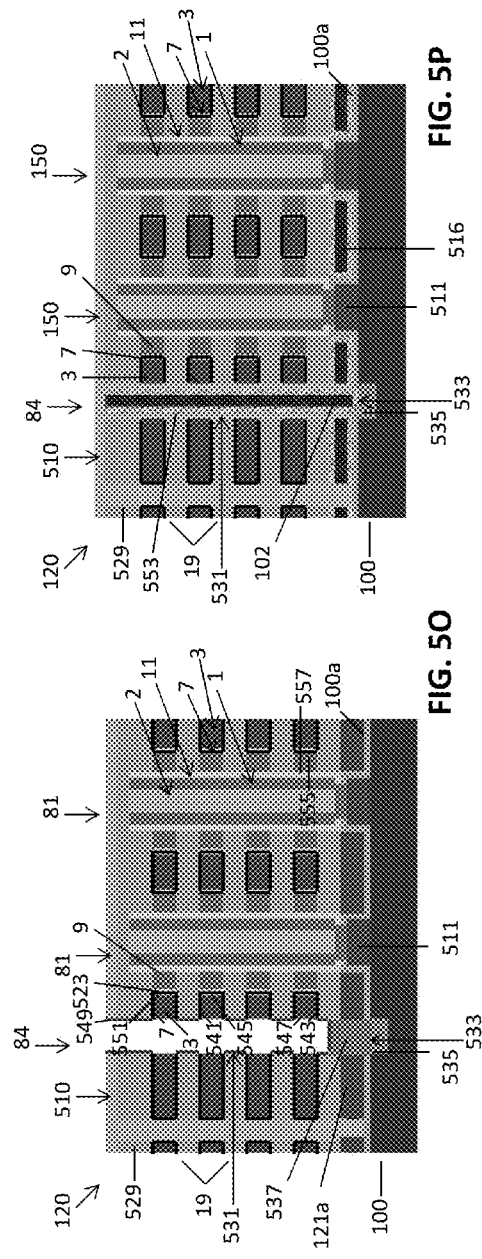

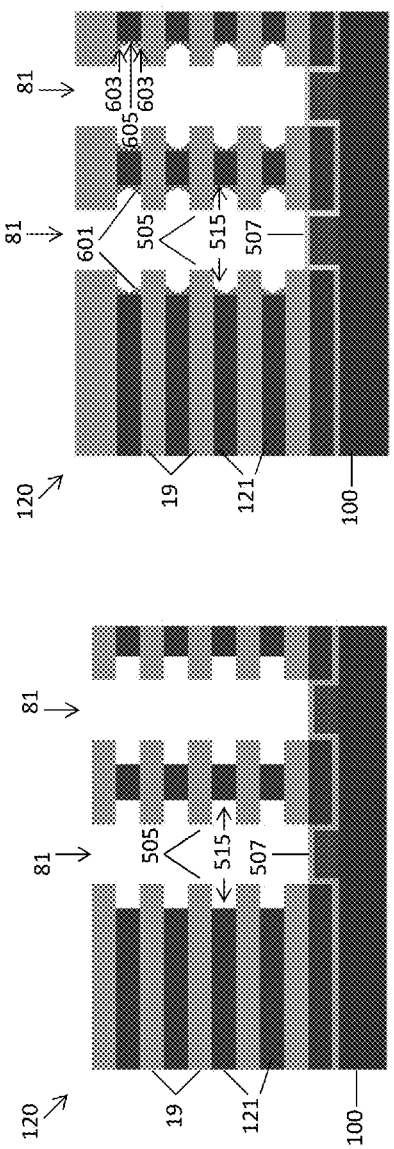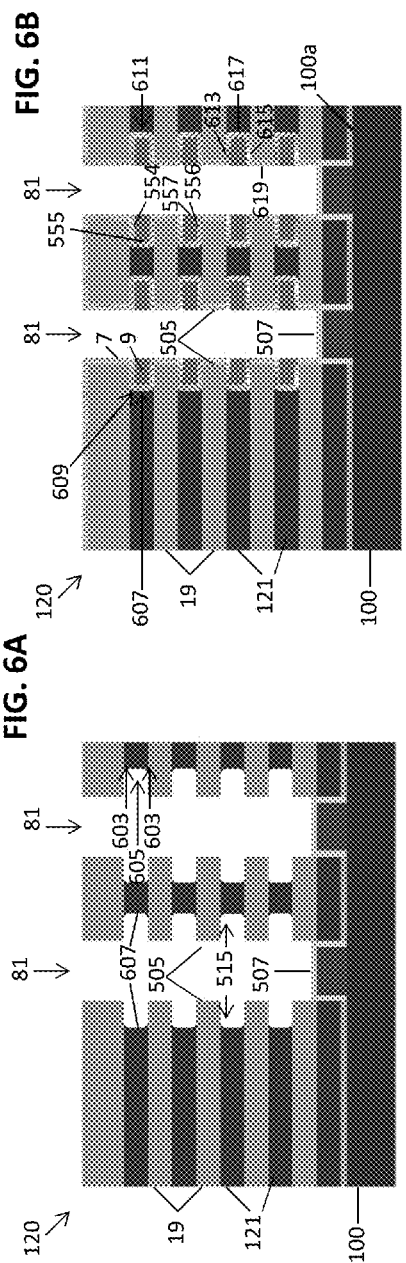

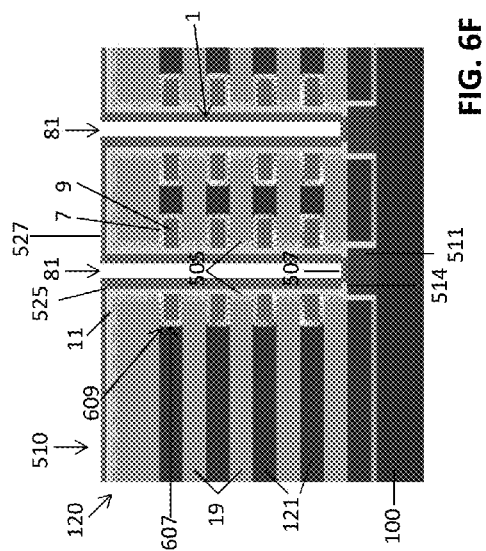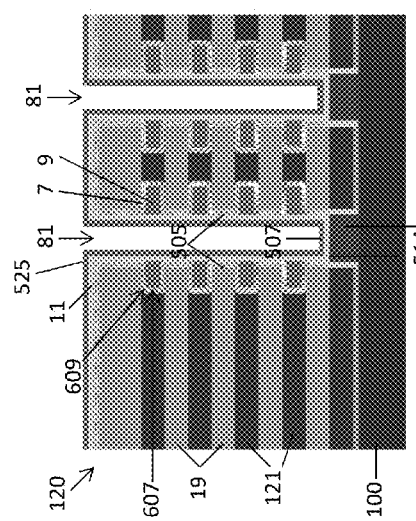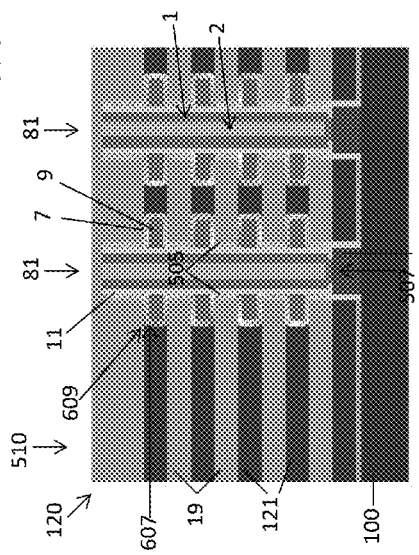

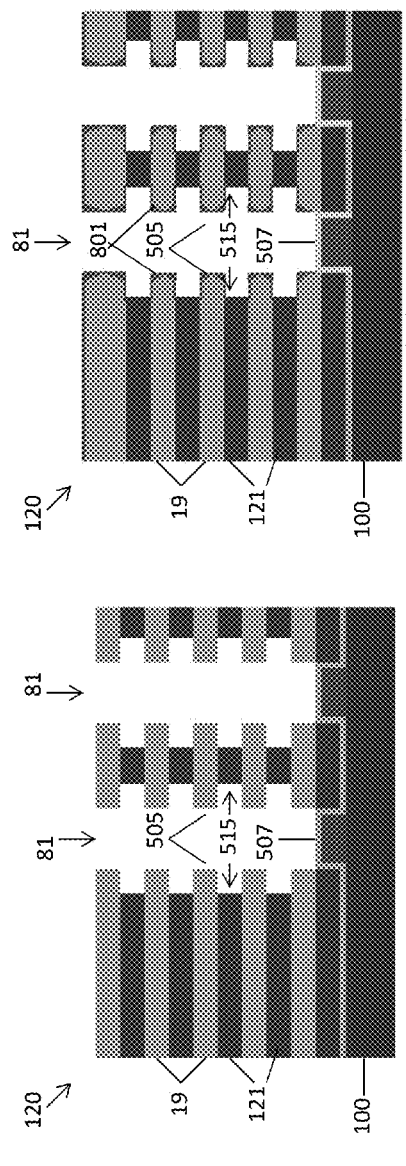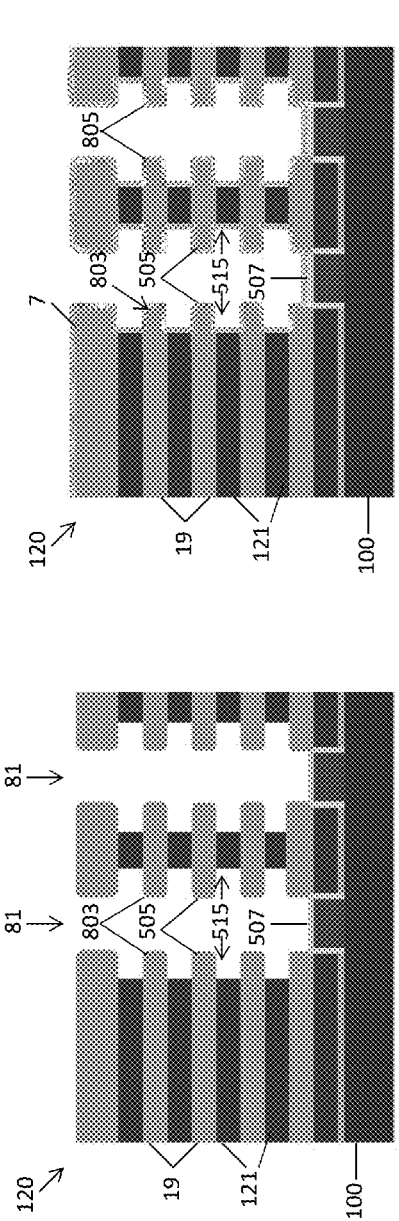
FIG. 8A
FIG. 8B
FIG. 8C
FIG. 8D

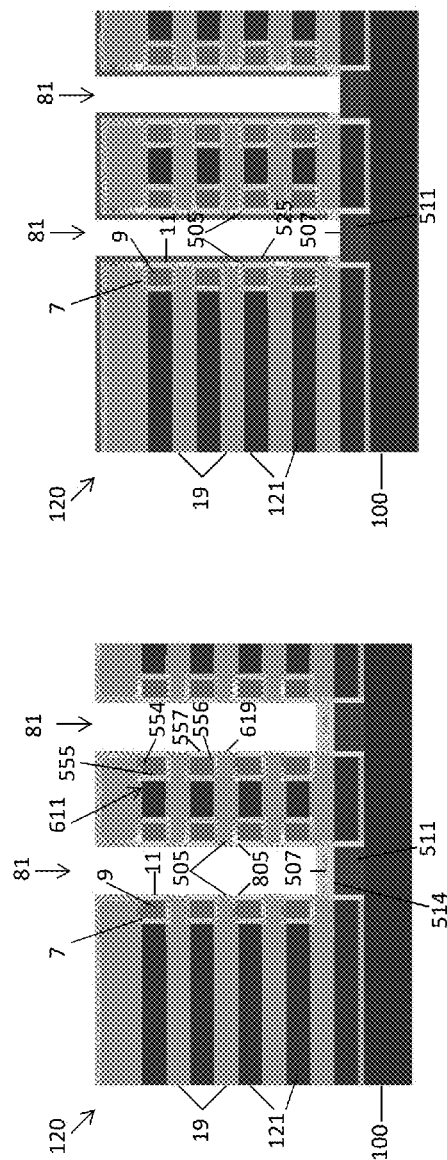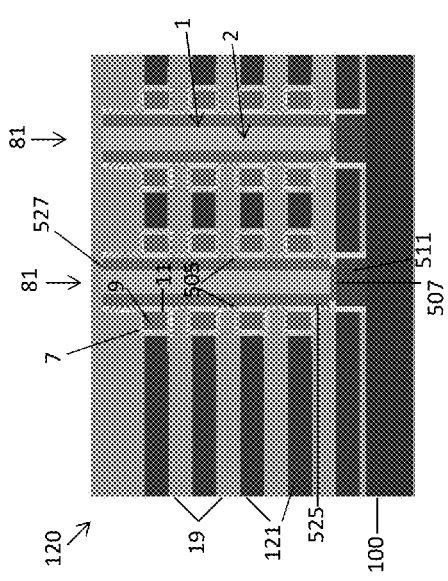

THREE DIMENSIONAL NAND STRING MEMORY DEVICES AND METHODS OF FABRICATION THEREOF

FIELD

The present disclosure relates generally to the field of semiconductor devices and Fspecifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string including forming a stack of alternating layers of a first material and a second material different than the first material over a substrate, etching the stack to form a front side opening in the stack having a sidewall defined at least partially by the alternating layers of the first material and the second material, removing a first portion of the second material layers through the front side opening to form front side recesses between the first material layers, forming an amorphous or polycrystalline semiconductor material over at least a portion of the sidewall of the front side opening and within the front side recesses, forming a layer of a metal material over at least a portion of the sidewall of the front side opening and adjacent to the amorphous or polycrystalline semiconductor material within the front side recesses, annealing the metal material and the amorphous or polycrystalline semiconductor material within the front side recesses to form a large grain polycrystalline or single crystal semiconductor material charge storage region within each of the front side recesses by a metal induced crystallization process, where following the metal induced crystallization process at least a portion of the metal material is located between the charge storage regions and the second material layers, forming a tunnel dielectric layer over the charge storage regions in the front side opening, and forming a semiconductor channel over the tunnel dielectric layer in the front side opening.

Another embodiment relates to a method of making a monolithic three dimensional NAND string including forming a stack of alternating layers of a first material and a second material different than the first material over a substrate, etching the stack to form a front side opening in the stack having a sidewall defined at least partially by the alternating layers of the first material and the second material, removing a first portion of the second material layers through the front side opening to form a plurality of front side recesses between the first material layers, each of the front side recesses having a first side adjacent to the front side opening and a second side opposite the first side defined by a concave-shaped surface of a second material layer, forming a blocking dielectric within the front side recesses including over the concave-shaped surfaces of the second material layers, where the blocking dielectric includes a convex-curved outer surface facing the concave-shaped surfaces of the second material layers, forming a charge storage material over the blocking dielectric within the front side recesses, forming a tunnel dielectric layer over the charge storage regions in the front side opening, and forming a semiconductor channel over the tunnel dielectric layer in the front side opening.

Another embodiment relates to a method of making a monolithic three dimensional NAND string including forming a stack of alternating layers of a first oxide material and a second sacrificial material different than the first oxide material over a substrate, etching the stack to form a front side opening in the stack having a sidewall defined at least partially by the alternating layers of the first material and the second material, removing a first portion of the second sacrificial material layers through the front side opening to form a plurality of front side recesses between the first oxide material layers, performing a surface nitridation of the layers of first oxide material to form oxynitride regions over the portions of the layers exposed on the sidewall of the front side opening and over the portions of the layers exposed to the front side recesses, etching through the front side opening to selectively remove at least a portion of the oxynitride regions from the layers of the first oxide material to provide convexly-rounded corner portions of the layers of the first oxide material extending between the front side recesses and the sidewall of the front side opening, forming a blocking dielectric over the sidewall of the front side opening, the convexly-rounded corner portions of the layers of the first oxide material and within the front side recesses, forming a charge storage material over the blocking dielectric within the front side recesses, forming a tunnel dielectric material over the charge storage regions in the front side opening, and forming a semiconductor channel over the tunnel dielectric material in the front side opening.

Another embodiment relates to a monolithic three-dimensional NAND string that includes a semiconductor channel, where at least one end portion of the semiconductor channel extends substantially perpendicular to a major surface of a substrate. A plurality of control gates extend substantially parallel to the major surface of the substrate, where each control gate includes a first side surface facing the at least one end portion of the semiconductor channel. The plurality of control gates include at least a first control gate located in a first device level and a second control gate located in a second device level located over the major surface of the substrate and below the first device level. A plurality of vertically spaced apart charge storage regions each include a first side surface facing a control gate and a second side surface facing the at least one end portion of the semiconductor channel. The charge storage regions include a single crystal or large grain polycrystalline semiconductor material and include at least one of a nickel and a nickel oxide residue located proximate to the first side surface of the charge storage region. The plurality of vertically spaced apart charge storage regions include at least a first spaced apart charge storage region located in the first device level and a second spaced apart charge storage region located in the second device level. A blocking dielectric is located between the first side surface of the control gates and the first side surface of the charge storage regions. A tunnel dielectric is located between each one of the plurality of the vertically spaced apart charge storage regions and the semiconductor channel.

Another embodiment relates to a monolithic three-dimensional NAND string that includes a semiconductor channel, where at least one end portion of the semiconductor channel extends substantially perpendicular to a major surface of a substrate. A plurality of control gates extend substantially parallel to the major surface of the substrate, where each control gate includes a first side surface facing the at least one end portion of the semiconductor channel. The plurality of control gates include at least a first control gate located in a first device level and a second control gate located in a second device level located over the major surface of the substrate and below the first device level. A plurality of vertically spaced apart charge storage regions each include a top surface, a bottom surface opposite the top surface, a first side surface facing a control gate and a second side surface facing the at least one end portion of the semiconductor channel. The plurality of vertically spaced apart charge storage regions include at least a first spaced apart charge storage region located in the first device level and a second spaced apart charge storage region located in the second device level. A blocking dielectric includes a plurality of clam-shaped portions surrounding the charge storage regions on the top, bottom and first sides surfaces of the charge storage regions, the clam-shaped portions including convexly-rounded exterior surfaces facing the first side surfaces of the control gates. A tunnel dielectric is located between each one of the plurality of the vertically spaced apart charge storage regions and the semiconductor channel.

Another embodiment relates to a monolithic three-dimensional NAND string that includes a semiconductor channel, where at least one end portion of the semiconductor channel extends substantially perpendicular to a major surface of a substrate. A plurality of control gates extend substantially parallel to the major surface of the substrate, where each control gate includes a first side surface facing the at least one end portion of the semiconductor channel. The plurality of control gates include at least a first control gate located in a first device level and a second control gate located in a second device level located over the major surface of the substrate and below the first device level. A plurality of vertically spaced apart charge storage regions each include a top surface, a bottom surface opposite the top surface, a first side surface facing a control gate and a second side surface facing the at least one end portion of the semiconductor channel. The plurality of vertically spaced apart charge storage regions include at least a first spaced apart charge storage region located in the first device level and a second spaced apart charge storage region located in the second device level. A blocking dielectric includes a plurality of clam-shaped portions surrounding the charge storage regions on the top, bottom and first sides surfaces of the charge storage regions, a plurality of substantially straight segments extending substantially perpendicular to the major surface of the substrate between the clam-shaped portions and a plurality of rounded edge portions between the straight portions and the clam-shaped portions. A tunnel dielectric is located between each one of the plurality of the vertically spaced apart charge storage regions and the semiconductor channel.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 6A-6G are side cross sectional views illustrating a method of making a NAND string memory device according to another embodiment.

FIGS. 8A-8G are side cross sectional views illustrating a method of making a NAND string memory device according to yet another embodiment.

DETAILED DESCRIPTION

Various embodiments relate to monolithic three-dimensional NAND memory strings and methods of fabricating a monolithic three-dimensional NAND memory string. In one embodiment, single crystal or large grain polycrystalline semiconductor material charge storage regions are formed by a metal induced crystallization process. In another embodiment, a plurality of front side recesses are formed having a concave-shaped surface and a blocking dielectric and charge storage regions are formed within the front side recesses and over the concave-shaped surface. In another embodiment, layers of oxide material exposed in a front side opening of a material layer stack are surface nitrided and etched to provide convexly-rounded corner portions, and a blocking dielectric is formed over the convexly-rounded corner portions.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
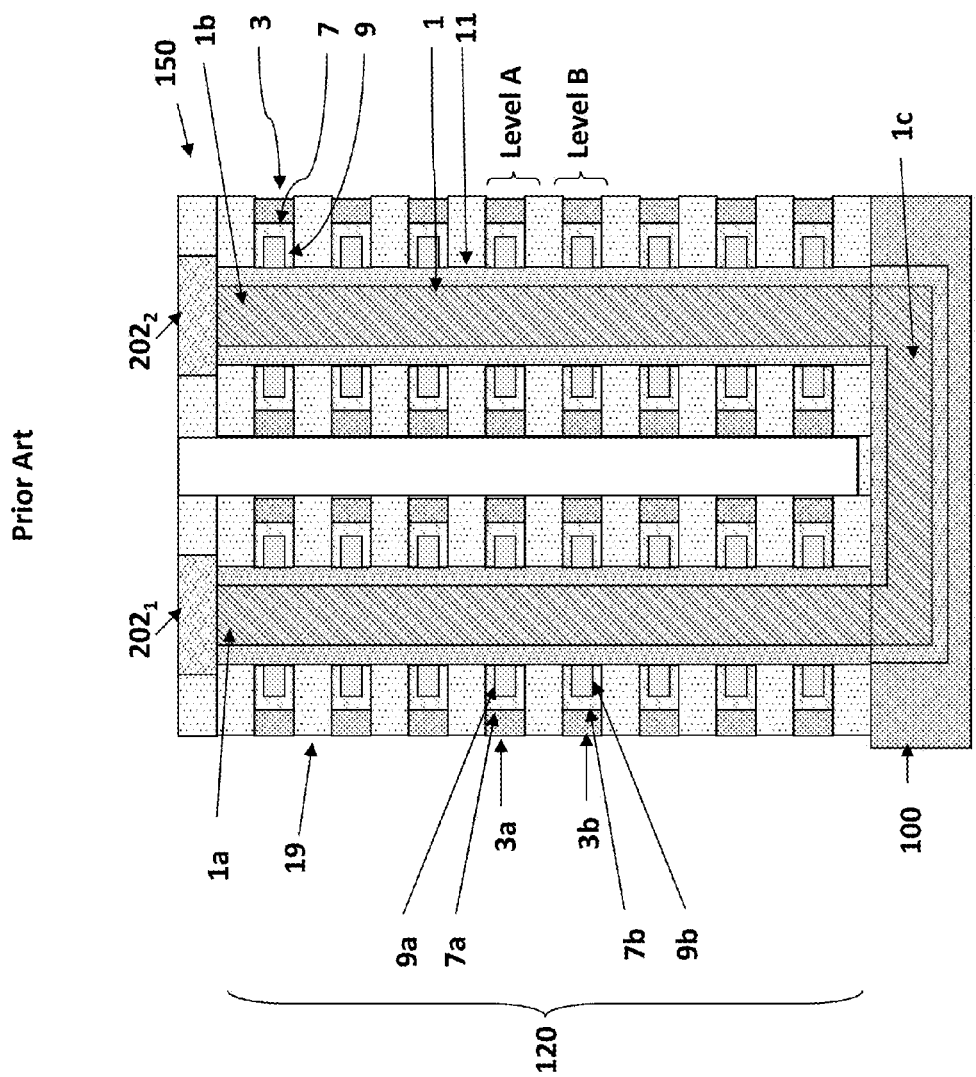
FIG. 3A is a side cross sectional view of a conventional NAND string of an embodiment with a U-shaped channel.
Figure 3B:
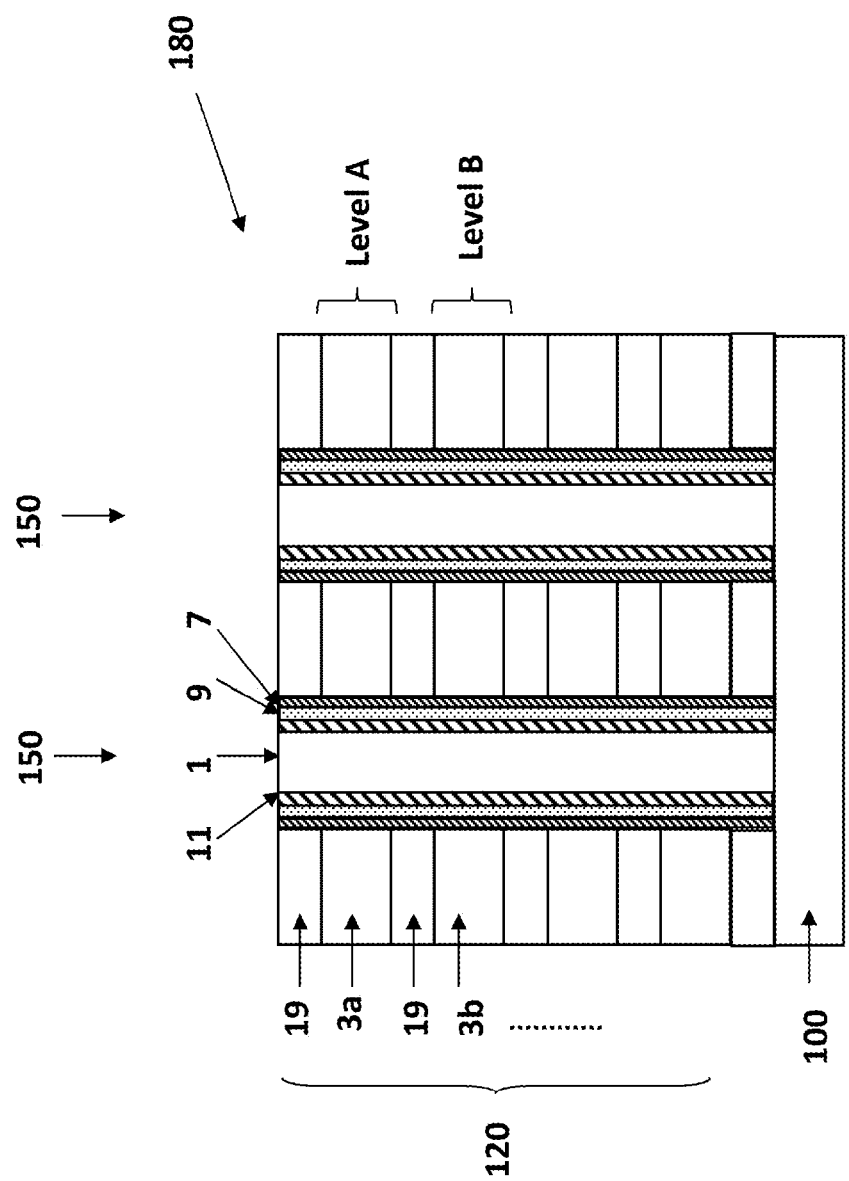
FIG. 3B is a side cross sectional view of another conventional NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 2A and 3B. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A, 2A and 3B for clarity) which may be located above and below the memory levels of the NAND string 150, respectively.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional back gate electrode (not shown) may be disposed in the substrate 100 below the semiconductor channel 1. The NAND string 150 in this embodiment may further include drain-side and source-side select or access transistors (not shown in FIG. 3A for clarity), both of which may be located above the memory levels of the NAND string 150 and electrically connected to the respective wing portions 1a and 1b of the semiconductor channel 1.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials. In some embodiments described further below, the control gate material may comprise single crystal or large grain polycrystalline semiconductor material (e.g., silicon). For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise one or more layers having a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprises a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions or segments 9 located between the blocking dielectric and the channel 1, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles. In some embodiments, described in further detail below, the charge storage regions 9 may be floating gates comprising single crystal or large grain polycrystalline semiconductor material (e.g., silicon) that may be formed by a metal induced crystallization process.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a conventional memory device comprising one or more arrays 180 of NAND strings 150 having channels 1 located in respective memory holes 81 (e.g., front side openings). In this device, the memory holes 81 are circular, thereby resulting in cylindrical pillar shaped NAND strings 150. From the top view, the tunnel dielectric 11, charge storage region 9 and blocking dielectric 7 form concentric rings around the channel 1. The control gate 3 in each device level is generally slab shaped. A back side opening 84, such as a trench, electrically separates adjacent control gates 3 and arrays 180 (e.g., memory blocks) of NAND strings 150 from each other. As discussed in more detail below, the back side opening 84 may be used in the manufacture of NAND strings 150 according to some embodiments.

A first embodiment method of making a NAND string 150 is illustrated in FIGS. 5A-5P. In some embodiments, the methods described herein may be used to make a NAND string 150 having improved performance and scalability with respect to conventional devices, including an improved control gate 3 to charge storage region 9 coupling ratio. In this embodiment, single crystal or large grain polycrystalline semiconductor material formed by a metal induced crystallization process is used for the charge storage regions 9 and optionally for the control gates 3.

As illustrated in FIG. 5A, the method includes forming a stack 120 of alternating first material layers 19 and second material layers 121 over a major surface 100a of substrate 100. The second material is different from the first material. The layers 19, 121 may be formed by a suitable deposition method, such as sputtering, CVD, PECVD, MBE, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120. Alternatively, layers 19 may comprise silicon oxide and layers 121 may comprise polysilicon forming an OPOP stack 120.

The formation of layers 19, 121 may be followed by etching the stack 120 to form at least one front side opening 81 in the stack 120. An array of front side openings 81 (e.g., cylindrical memory openings of holes) may be formed in locations where vertical channels of NAND strings 150 will be subsequently formed.

The front side openings 81 may be formed by photolithography and etching as follows. First, a memory hole mask 501 may be formed over the stack 120 and patterned to form openings 503 exposing the stack 120 as shown in FIG. 5A. The mask 501 may comprise any suitable material, such as one or more layer of photoresist and/or hard mask material. Then, the stack 120 may be etched (e.g., using reactive ion etching (RIE)) to form the openings 81 in the stack through the openings 503 in the mask 501 as shown in FIG. 5B. In the embodiment of FIG. 5B, the etching may be stopped at the substrate 100. Alternatively, an etch stop layer may be formed over the substrate and the etching may be stopped on the etch stop layer. Following the etching to form the front side memory openings 81, the mask 501 may be removed.

Each of the front side memory openings 81 may include a sidewall 505 defined by the exposed surfaces of the layers 19, 121 of the stack 120 and a bottom surface 507, which in this embodiment is defined by the exposed surface of the substrate 100.

Next, an insulating layer 509, such as an oxide layer (e.g., silicon oxide) may be formed over the stack 120 including over the sidewalls 505 and bottom surfaces 507 of each of the front side openings 81. An anisotropic etching process (e.g., an RIE process) may then be performed to remove the insulating layer 509 from the top surface 510 of the stack 120 and from the bottom surface 507 of each of the front side openings 81 to expose the semiconductor substrate 100, while the insulating layer 509 may remain over the sidewalls 505 of the front side openings 81, as shown in FIG. 5C.

A protrusion 511 comprising a semiconductor material may optionally be formed over the bottom surface 507 of each front side opening 81 and in contact with the surface 100a of the semiconductor substrate 100, as shown in FIG. 5D. In embodiments, an epitaxial single crystal semiconductor layer, such as a single crystal silicon layer (doped or undoped) may be epitaxially grown on the exposed major surface 100a of the substrate 100 over the bottom surface 507 of each opening 81 to form the protrusions 511. Alternatively, the protrusions 511 may be formed by forming a bottom epitaxial single crystal semiconductor (e.g., silicon) layer over the bottom surface 507 of the front side opening 81, and then forming at least one layer of a second material, such as a second semiconductor material (e.g., a polycrystalline semiconductor material, such as polysilicon), a metal and/or a metal nitride, over the bottom epitaxial single crystal semiconductor layer within each of the openings 81. Alternatively, a polycrystalline semiconductor (e.g., silicon) layer (doped or undoped) may be formed over the bottom surface 507 of the front side opening 81 and may then be recrystallized by thermal treatment or by laser annealing to form a single crystal or large grain polycrystalline semiconductor material.

The front side openings 81 may then be etched (e.g., using a wet chemical etch) to remove the insulating layer 509 from the sidewall 505 of the opening 81 above the protrusion 511, as shown in FIG. 5D. The insulating layer 509 may remain adjacent to the protrusion 511. A cover layer 514 (e.g., an oxide layer) may be formed over the top surface of the protrusions 511 as shown in FIG. 5D.

The protrusions 511 may comprise semiconductor channel portions of a lower (e.g., source-side) select or access transistor of the completed NAND string 150. In the completed NAND string 150, the protrusion 511 may be connected at a first (e.g., top) end to the vertically-oriented semiconductor channel 1 of the NAND string 150 (see FIGS. 1A-2B, 3B and 4) and at a second (e.g., bottom) end to a horizontal channel portion 513 located on or within the substrate 100 and extending substantially parallel to the major surface 100a of the substrate 100. Each protrusion 511 may have a substantially pillar- or rail-shaped structure extending from the surface 100a of the substrate 100, and may be surrounded by the insulating layer 509. As described below with reference to FIG. 5P, the layer 121a of sacrificial second material adjacent to the protrusions 511 may be removed through a back side opening 84 (e.g., slit trench) and replaced by a conductive gate electrode material 516 (see FIG. 5P). The insulating layer 509 may comprise a gate insulator located between the gate electrode 516 and the protrusion 511 (i.e., semiconductor channel) of the lower (e.g., source side) select transistor. Examples of suitable configurations and methods for making the lower (e.g., source side) select transistors of a monolithic three dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

In some embodiments, the lower (e.g., source side) select transistor(s) may be initially formed on or within the substrate 100 and the stack 120 of alternating material layers 19, 121 may be formed over the select transistors. For example, the protrusions 511, conductive gate electrode 516 and gate insulators 509 of the lower select transistors may be formed over the substrate 100 and the layers 19, 121 may be formed over the lower select transistors. The stack 120 may then be etched to form the front side openings 81 and the etching may be stopped at the cover layer 514 over the top surface of the protrusions 511.

Figure 5E:
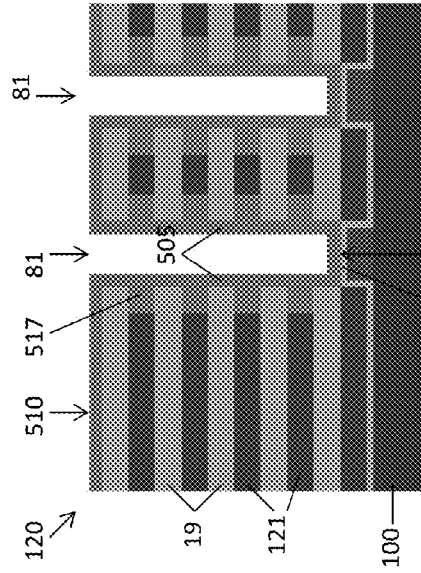
FIGS. 5A-5P are side cross sectional views illustrating a method of making a NAND string memory device according to one embodiment.

Referring to FIG. 5E, a first portion of the second material layers 121 is removed through the front side openings 81 to form front side recesses 515 between the first material layers 19. In embodiments, the second material layers 121 may comprise silicon nitride that is selectively etched relative to the material (e.g., silicon oxide) of the first material layers 19 to form the front side recesses 515. The layers 121 may be etched using a wet chemical etching process (e.g., using a hot phosphoric acid etch).

Figure 5F:
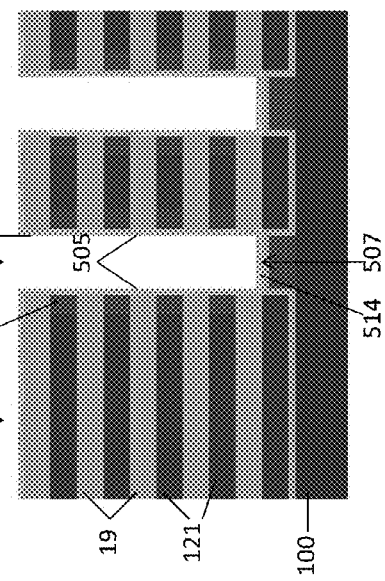

Referring to FIG. 5F, a layer of amorphous or polycrystalline semiconductor material 517 (e.g., amorphous silicon or polysilicon) may be formed over at least a portion of the sidewall 505 of the front side opening 81 and within the front side recesses 515. The layer 517 may also be formed over the cover layer 514 on the bottom surface 507 of the front side opening 81 and over the top surface 510 of the stack 120, as shown in FIG. 5F.

Figure 5G:
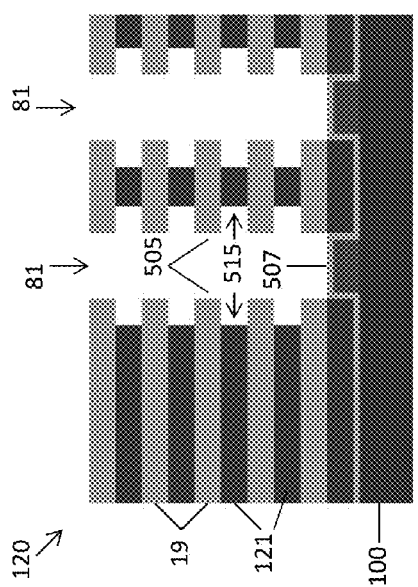

The exposed surface of the layer 517 of amorphous or polycrystalline semiconductor material may be subjected to an optional precleaning process to remove any native oxide material (e.g., silicon oxide) from the surface. A layer of a metal material 519 may then be formed over at least a portion of the sidewall 505 of the front side opening 81 and adjacent to the amorphous or polycrystalline semiconductor material 517 within the front side recesses 515, as shown in FIG. 5G. In one embodiment, the layer of metal material 519 may comprise nickel that is deposited by CVD over the stack 120, including over the top surface 510 of the stack 120 and on the sidewalls 505 and bottom surfaces 507 of the front side openings 81. Other metals (e.g., aluminum, palladium, gold, etc.) may also be utilized as an alternative to or in addition to nickel.

Figure 5H:
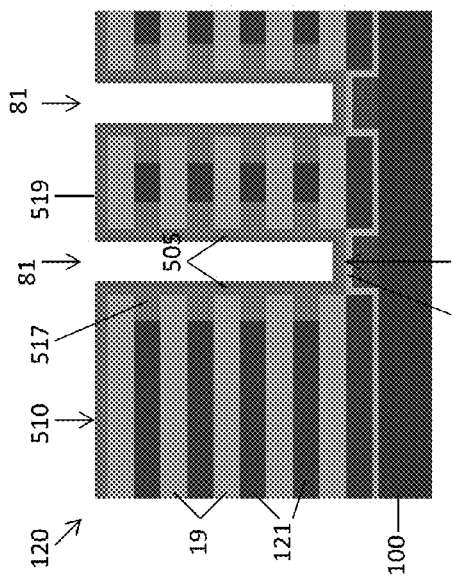

The stack 120 may undergo an optional rapid thermal annealing (RTA) process, which may promote diffusion of the metal material 519 (e.g., nickel) into the amorphous or polycrystalline semiconductor material 517. The layer of metal material 519 may then be oxidized to form a metal oxide layer 521 (e.g., nickel oxide) over at least a portion of the sidewall 505 and the bottom surface 507 of the front side openings 81, as shown in FIG. 5H.

Referring to FIG. 5I, the layer of amorphous or polycrystalline semiconductor material 517 and the layer of metal material 519, which may be partially or completely converted to a metal oxide material 521, are annealed to form large grain polycrystalline or single crystal semiconductor charge storage regions 9 within each of the front side recesses 515 by a metal induced crystallization process. In the metal induced crystallization process, the stack 120 may be annealed at an elevated temperature (e.g., between 100° C. to about 550° C.) such that the metal material forms a crystal growth front 523 that propagates laterally (i.e., generally parallel to the major surface 100a of the substrate) through the amorphous or polycrystalline semiconductor material 517 within the front side recesses 515. As the growth front 523 propagates, it converts the amorphous or polysilicon material into charge storage regions 9 comprised of single crystal or large grain polysilicon semiconductor material (e.g., silicon).

As used herein, the amorphous or polysilicon semiconductor material 517 is converted to large grain polysilicon material when the average grain size of the semiconductor material 517 within the front side recesses 515 is increased by at least 20% during the crystallization process. In some embodiments, where the initial material 517 comprises polysilicon, the average grain size of the polysilicon may increase from a nanometer scale average grain size (e.g., less than about 500 nm) to an average grain size of about 1 micron or more (e.g., about 1 micron to about 5 microns) in the charge storage regions 9 following the metal induced crystallization process.

Following the metal induced crystallization process, the growth front 523 which comprises at least a portion of the metal material 519 may be located between the single crystal or large grain polycrystalline material charge storage regions 9 and the second material layers 121 of the stack 120, as shown in FIG. 5I.

Referring to FIG. 5J, the front side opening 81 may be etched to remove the layer of metal oxide material 521 from the sidewall 505 and the bottom surface 507 of the front side opening 81. In one embodiment, the layer of metal oxide material 521 may be selectively etched using a sulfuric acid and hydrogen peroxide etch.

Referring to FIG. 5K, a tunnel dielectric layer 11 (e.g., an oxide layer, such as a silicon oxide or silicon oxynitride layer) may be formed over the stack 120, including over the charge storage regions 9 on the sidewall 505 of each of the front side memory openings 81, and may also be formed over the bottom surface 507 of the front side openings 81 (not shown in FIG. 5K).

Referring again to FIG. 5K, a semiconductor cover layer 525 (e.g., a polysilicon or amorphous silicon layer) may be formed over the stack 120, including over the tunnel dielectric layer 11 on the sidewall 505 of each of the front side openings 81, and may also be formed over the bottom surface 507 of the front side openings 81 (not shown in FIG. 5K). An anisotropic etching process (e.g., a reactive ion etch (RIE) process) may be used to remove the semiconductor cover layer 525, the tunnel dielectric layer 11, and the cover layer 514 from over the bottom surfaces 507 of the front side openings 81 to expose the protrusions 511 (or substrate 100 if protrusions 511 are omitted) at the bottom surfaces 507 of the front side openings 81, as shown in FIG. 5K. The semiconductor cover layer 525 may protect the tunnel dielectric layer 11 and the charge storage regions 9 on the sidewalls 505 of the front side memory openings 81 from etching damage.

Referring to FIG. 5L, a semiconductor material channel layer 527 (e.g. a polysilicon or amorphous silicon layer) is formed over the stack 120 including over the semiconductor cover layer 525 along the sidewall 505 of each of the front side openings 81 and over the exposed protrusion 511 (or substrate 100 if protrusions 511 are omitted) on the bottom surface 507 of each of the front side openings 81. The semiconductor material channel layer 527 may contact the semiconductor cover layer 525 within each of the front side openings 81 and together the layers 525, 527 may form a vertically oriented semiconductor channel 1 as described above with reference to FIGS. 1A-2B and 3B. Layers 527, 525 and 11 may be removed from the top surface 510 of the stack 120 (e.g., via etching or chemical mechanical polishing (CMP)), and an insulating fill material 2 (e.g., an oxide, such as silicon oxide from a TEOS source) may be formed over the stack 120 and filling the front side openings 81, as shown in FIG. 5L.

Referring to FIG. 5M, at least one support column 529 may be formed extending substantially perpendicular to the major surface 100a of the substrate 100. The at least one support column 529 may be formed by etching through the layers 19, 121 of the stack 120 to form an opening and filling the opening with a suitable material, such as an insulating material (e.g., an oxide, such as silicon oxide). The at least one support column 529 may provide mechanical support for layers 19 during a control gate replacement step, as described below.

Referring again to FIG. 5M, the stack 120 may be etched (e.g., through a mask patterned by photolithography, not shown in FIG. 5M) to form one or more back side openings (e.g., trenches) 84 in the stack 120. In this embodiment, the back side opening (e.g., trench) 84 extends through the entire stack 120 to the semiconductor substrate 100. The alternating layers 19, 121 of the stack 120 may at least partially define the sidewalls 531 of the back side opening 84, and the substrate 100 may define the bottom surface 533 of the back side opening 84. A source region 535 may be formed in the semiconductor substrate 100 through the back side opening 84. For example, when the back side opening 84 will contain the lower (e.g., source side) electrode 102 for the NAND strings 150 (see FIGS. 1A and 2A), the source region 535 may comprise an n-type doped source region at the bottom 533 of the back side opening 84 that may be formed via N+ ion implantation followed by an annealing step. Alternatively or in addition, a metal (e.g., tungsten) silicide layer (not shown in FIG. 5M0 may be formed over the bottom surface 533 of the back side opening 84 to reduce contact resistance. In other embodiments, the back side opening 84 may contain a contact to a doped well region (e.g., p-well region) of the substrate 100, in which case the bottom surface 533 of the back side opening 84 may be doped p-type via implantation.

Following the formation of the source region 535, a fill material 537 may partially fill the back side opening 84 as shown in FIG. 5N, and may extend at least adjacent to the layer 121a of sacrificial second material that is adjacent to the protrusions 511. The fill material 537 may protect the source region 535 and layer 121a from being etched during a subsequent gate replacement step, as described below.

Referring again to FIG. 5N, at least a portion of the second material layers 121 may be removed through the back side opening 84 to form back side recesses 539 between the first material layers 19. Layers 121 may be removed by selective etching, such as a silicon nitride selective etching (e.g., a hot phosphoric acid wet etch) which removes silicon nitride layers 121 but does not remove the silicon oxide layers 19. The at least one support column 529 may support the silicon oxide layers 19 after the portions of the sacrificial second material layers 121 are removed. The selective etch may use the metal material growth front 523 as an etch stop.

Referring to FIG. 5O, a blocking dielectric 7 may be formed in the back side recesses 539 through the back side opening 84. In this embodiment, at least a portion of the metal material (e.g., nickel and/or nickel oxide) growth front 523 is retained in the back side recesses 539, and the blocking dielectric 7 is formed in contact with the metal material growth front 523. Alternatively, the metal material growth front 523 may be removed via one or more etching steps, leaving only a residue of the metal material (e.g., nickel or nickel oxide) in the charge storage regions 9, and the blocking dielectric 7 may be formed in contact with the charge storage regions 9.

The blocking dielectric 7 may comprise a stack of two or more different insulating layers comprising different insulating materials. For example, the different insulating materials may include silicon oxide, silicon nitride, silicon oxynitride and/or a high-k material such as $Al_2O_3$, $HfO_2$, HfSiO, $Ta_2O_5$ or other metal oxides. In one embodiment, the blocking dielectric 7 may include a stack comprising at least one layer of silicon oxide and at least one layer of a metal oxide, such as aluminum oxide and/or hafnium oxide. In embodiments, the blocking dielectric 7 may include at least one of aluminum oxide and silicon oxynitride.

Referring again to FIG. 5O, control gates 3 may be formed over the blocking dielectric 7 in the back side recesses 539 through the back side opening 84. Each of the control gates 3 may include a top surface 541, a bottom surface 543 opposite the top surface 541, a first side surface 545 facing the vertically-extending semiconductor channel 1 in the memory opening 81, and a second side surface 547 that may form a portion of a sidewall 531 of the back side opening 84. The control gates 3 may be formed over the blocking dielectric 7 such that the blocking dielectric 7 surrounds each of the control gates 3 on the top 541, bottom 543 and first side surfaces 545 of the control gate 3.

In one embodiment, the control gates 3 may comprise single crystal or large grain polycrystalline semiconductor material (e.g., single crystal silicon or large grain polysilicon) that is formed by a metal induced crystallization process. The control gates 3 may be formed using a similar process as the process used for forming the charge storage regions 9 as described above. In particular, an amorphous or polycrystalline silicon material may be formed over at least a portion of a sidewall 531 of the back side opening 84 and over the blocking dielectric 7 within the back side recesses 539, and a layer of metal material (e.g., nickel) may be formed over a least a portion of the sidewall 531 of the back side opening 84 and adjacent to the amorphous or polycrystalline semiconductor material within the back side recesses 539. The metal material may be annealed (e.g., via a rapid thermal anneal) to diffuse the metal material into the semiconductor material, and oxidized to form a metal oxide layer 549 over the sidewall 531 and bottom surface 533 of the back side opening 84, as shown in FIG. 5O. In one embodiment, if the control gates 3 comprise silicon, then the control gate replacement process may be omitted and the original polysilicon layer 121 of the OPOP stack 120 may be crystallized by metal induced crystallization. Alternatively, the control gate replacement process may be used to replace silicon nitride sacrificial layers 121 with amorphous or polycrystalline silicon layers as described above, followed by metal induced crystallization. The metal material and the amorphous or polycrystalline semiconductor material within the back side recesses 539 may then be annealed to form large grain polycrystalline or single crystal semiconductor material control gates 3 within each of the back side recesses 539 by a metal induced crystallization process. During the metal induced crystallization process, portions of the metal material (i.e., metal oxide layer 549) adjacent to the control gates 3 may form a crystal growth front 551 that propagates from the second side surface 547 of the control gates 3 (i.e., adjacent to the back side opening 84) towards the first side surface 545 of the control gates 3 (i.e., adjacent to the blocking dielectric 7). Following the metal induced crystallization process at least a portion of the metal material of the growth front 551 may be located between the control gates 3 and the charge storage regions 9, as shown in FIG. 5O. Additional portions of the metal material (i.e., metal oxide layer 549) not located adjacent to the control gates 3 may remain on the sidewalls 531 and bottom surface 533 of the back side opening 84, as shown in FIG. 5O. The remaining portions of the layer 549 may be removed by etching (e.g., using a sulfuric acid and hydrogen peroxide etch).

Alternatively, the control gates 3 may comprise one or more electrically conductive materials, such as a metal, metal nitride, metal silicide or heavily doped semiconductor material. In one embodiment, the control gates 3 may be formed by depositing a metal nitride liner material (e.g., tungsten nitride (WN) or titanium nitride (TiN) liner) over the blocking dielectric 7 in the back side recesses 539, followed by depositing a metal material (e.g., tungsten) over the metal nitride liner material to fill the back side recesses 539.

As shown in FIG. 5O, the charge storage regions 9 in this embodiment comprise a plurality of vertically spaced apart floating gate charge storage regions 9, where each charge storage region includes a first side surface 555 facing a respective control gate 3, and a second side surface 557 facing the semiconductor channel 1 within the front side opening 81. Each of the charge storage regions 9 may comprise a single crystal or large grain polycrystalline semiconductor material that includes a metal material, such as a nickel and/or nickel oxide residue (e.g., at least a portion of the crystal growth front 523), located proximate to the first side surface 545 of the charge storage region 9. The charge storage regions 9 and the control gates 3 may be located in respective device levels (e.g., Level A, Level B, etc., as shown in FIGS. 1A, 2A and 3A-B) of the stack 120, which may be separated by interlevel insulating layers 19.

Referring to FIG. 5P, the fill material 537 at the bottom of the back side opening 84 may be removed by etching, and the layer 121a of second material may be removed by etching through the back side opening 84 (e.g., via a hot phosphoric acid wet etch) and a lower (e.g., source) select gate electrode 516 may be formed adjacent to the protrusions 511. The select gate electrode 516 may comprise one or more electrically conductive materials, such as a metal, metal nitride, metal silicide or heavily doped semiconductor material. In one embodiment, the select gate electrode 516 may be formed by depositing a metal nitride liner material (e.g., tungsten nitride (WN) or titanium nitride (TiN) liner) and a metal material (e.g., tungsten) over the metal nitride liner material.

Referring again to FIG. 5P, a layer of insulating material 553 (e.g., silicon oxide) may be formed over the sidewalls 531 of the back side opening 84 (i.e., slit trench) while the source region 535 at the bottom surface 533 of the back side opening 84 may be exposed. A source side electrode 102 (i.e., source line) comprising an electrically conductive material may be formed within the back side opening 84 and electrically contacting the source region 535 at the bottom surface 533 of the back side opening 84. The layer of insulating material 553 may electrically insulate the source side electrode 102 from the plurality of control gates 3 along the sidewalls 531 of the back side opening 84. The source side electrode 102 may comprise one or more electrically conductive materials, such as a metal, metal nitride, metal silicide or heavily doped semiconductor material. In one embodiment, the source side electrode 102 may be formed by depositing a metal nitride liner material (e.g., WN or TiN liner) over the layer of insulating material 553 followed by depositing a metal material (e.g., W) over the metal nitride liner material to fill the back side opening 84. Alternatively, one or more electrically conductive materials (e.g., a metal material) may be formed over the layer of insulating material 535 and in electrical contact with a doped well region (e.g., p-well region) of the substrate 100 at the bottom 533 of the back side opening 84.

A second embodiment method of making a NAND string 150 with concave-shaped surfaces in the front side recesses is illustrated in FIGS. 6A-6G. The method of FIGS. 6A-6G may be used as an alternative to or in addition to any of the steps of illustrated in FIGS. 5A-5P. FIG. 6A corresponds to FIG. 5E, and shows the stack 120 after etching the stack to form the front side openings 81 and removing portions of the second material layers 121 through the front side openings 81 to form front side recesses 515 between the first material layers 19. In this embodiment, the first material layers 19 comprise an oxide material (e.g., silicon oxide) and the second material layers comprise a nitride material (e.g., silicon nitride), forming an ONON stack 120. An alternative embodiment in which the second material layers comprise a semiconductor material (e.g., polysilicon) forming an OPOP stack 120 is described below with reference to FIGS. 7A-7C.

The front side recesses 515 may be formed by selectively etching the layers 121 of second material relative to the first material using a first etching process to provide recessed portions of the second material between layers 19 of the first material. The surfaces of the layers 121 of the second material that are exposed within the recessed portions 515 may be oxidized to form oxidized surfaces 601 as shown in FIG. 6B. In embodiments, the oxidized surfaces 601 may be formed using a batch isotropic oxidation process. The exposed surfaces of layers 121 may be oxidized under conditions that provide a higher rate of oxide formation in corner regions 603 of the recessed portions 515 proximate to the adjacent first material layers 19 than in central regions 605 of the recessed portions 515 distal to the corner regions 603. In some embodiments, the oxidized surfaces 601 may comprise a 3-5 nm thick layer of oxide material (e.g., silicon oxynitride) in the corner regions 603 and a relatively thinner layer of oxide material in the central regions 605.

In embodiments, the oxidation may be performed at a temperature of about 400° C. or less (e.g., between about 300° C. and about 380° C.) in a controlled pressure environment. In embodiments, the oxidation may be performed in an environment comprising nitrogen, hydrogen and oxygen gas. In some embodiments, the oxidation may be performed in an environment containing ozone gas ($O_3$), which may be provided from an ozone generator. The oxidation may be performed by subjecting the stack 120 to a gas flow including 10-50 standard cubic cm per minute (sccm) of ozone gas. One or more additional gases (e.g., $H_2$, $N_2$, etc.) may serve as a carrier for the ozone.

Referring to FIG. 6C, the oxidized surfaces 601 of the second material layers 121 are etched using a second etching process to form concaved-shaped surfaces 607 of the layers 121 within the recessed portions 515. The second etching process may have a higher etch rate for the material of the second material layers 121 (e.g., silicon nitride) than for the oxide material (e.g., silicon oxynitride) of the oxidized surfaces 601. Thus, the thicker layers of oxide material within the corner regions 603 may result in a lower etch rate for the corner regions 603 relative to the central regions 605 during the second etching process such that the second etching process forms concave-shaped surfaces 607 within the recessed portions 515.

Referring to FIG. 6D, a blocking dielectric 7 may be formed in the front side opening 81, including within the front side recesses 515, and over the concave-shaped surfaces 607 of the second material layers 121. The blocking dielectric 7 may be formed having a convex-curved outer surface 609 facing the concave-shaped surfaces 607 of the second material layers 121. The convex-curved outer surface 609 of the blocking dielectric 7 may be located between the charge storage regions 9 and the control gates 3 of the finished NAND strings and may help reduce leakage current through the blocking dielectric by reducing the electric field in "corner" regions of the blocking dielectric 7 by providing a generally rounded shape in the corner regions.

The blocking dielectric 7 may comprise a stack of two or more different insulating layers comprising different insulating materials. For example, the different insulating materials may include silicon oxide, silicon nitride, silicon oxynitride and/or a high-k material such as $Al_2O_3$, $HfO_2$, HfSiO, $Ta_2O_5$ or other metal oxides. In one embodiment, the blocking dielectric 7 may include a stack comprising at least one layer of silicon oxide and at least one layer of a metal oxide, such as aluminum oxide and/or hafnium oxide. In embodiments, the blocking dielectric 7 may include at least one of aluminum oxide and silicon oxynitride.

Referring again to FIG. 6D, a charge storage material may be formed over the blocking dielectric 7 within the memory openings 81 and may be recessed by a directional dry etch process to provide a plurality of vertically spaced apart charge storage regions 9 located within the front side recesses 515. The blocking dielectric 7 may surround the charge storage regions 9 on the top 554, bottom 556 and first side surfaces 555 of each of the charge storage regions 9. The second side surface 557 of the charge storage regions 9 may face the front side opening 81 and may define a portion of the sidewall 505 of the front side opening 81. An additional portion of the sidewall 505 may be defined by the blocking dielectric 7. The charge storage regions 9 may comprise floating gates comprised of a semiconductor material, such as (doped or undoped) polysilicon or silicon germanium, or a metal or metal alloy (e.g., TiN or metal silicide). The charge storage regions 9 may comprise a large grain polycrystalline or single crystal semiconductor material formed by a metal induced crystallization process, such as described above with reference to FIGS. 5A-5P. Alternatively, the charge storage regions 9 may comprise discrete regions of a dielectric charge storage material (e.g., silicon nitride).

As shown in FIG. 6D, the blocking dielectric 7 may include a plurality of clam-shaped portions 611 surrounding the charge storage regions 9 on the top 554, bottom 556 and first side surfaces 555 of each of the charge storage regions 9. As used herein a "clam" shape is a side cross sectional shape configured similar to an English letter "C". A clam shape has two segments 613, 615 which extend substantially parallel to each other and to the major surface 100a of the substrate 100. The two segments 613, 615 are connected to each other by a third segment 617 which extends substantially perpendicular to the first two segments and the surface 100a. The clam shape preferably contains an opening bounded by the three segments 613, 615, 617 and having a fourth side open. The convex-curved outer surface 609 of the blocking dielectric 7 forms an exterior surface of the clam shaped portion 611 facing the adjacent second material layer 121. The blocking dielectric 7 in this embodiment also includes substantially straight segments 619 extending in a direction substantially perpendicular to the major surface 100a of the substrate 100 (i.e., along the sidewall 505 of the front side opening 81) between the clam shaped portions 611.

Referring to FIG. 6E, a tunnel dielectric 11 (e.g., an oxide layer, such as a silicon oxide or silicon oxynitride layer) may be formed over the stack 120, including over the charge storage regions 9 and blocking dielectric 7 on the sidewall 505 of each of the front side memory openings 81, and may also be formed over the bottom surface 507 of the front side openings 81.

Referring again to FIG. 6E, a semiconductor cover layer 525 (e.g., a polysilicon or amorphous silicon layer) may be formed over the stack 120, including over the tunnel dielectric layer 11 on the sidewall 505 of each of the front side openings 81, and may also be formed over the bottom surface 507 of the front side openings 81.

Referring to FIG. 6F, an anisotropic etching process (e.g., a reactive ion etch (RIE) process) may be used to remove the semiconductor cover layer 525, the tunnel dielectric layer 11, and the cover layer 514 from over the bottom surfaces 507 of the front side openings 81 to expose the protrusions 511 (or substrate 100 if protrusions 511 are omitted) at the bottom surfaces 507 of the front side openings 81. The semiconductor cover layer 525 may protect the tunnel dielectric layer 11, the blocking dielectric 7 and the charge storage regions 9 on the sidewalls 505 of the front side memory openings 81 from etching damage.

Referring again to FIG. 6F, a semiconductor material channel layer 527 (e.g. a polysilicon or amorphous silicon layer) is formed over the stack 120 including over the semiconductor cover layer 525 along the sidewall 505 of each of the front side openings 81 and over the exposed protrusion 511 (or substrate 100 if protrusions 511 are omitted) on the bottom surface 507 of each of the front side openings 81. The semiconductor material channel layer 527 may contact the semiconductor cover layer 525 within each of the front side openings 81 and together the layers 525, 527 may form a vertically oriented semiconductor channel 1 as described above with reference to FIGS. 1A-2B and 3B.

Referring to FIG. 6G, layers 527, 525 and 11 may be removed from the top surface 510 of the stack 120 (e.g., via etching or chemical mechanical polishing (CMP), and an insulating fill material 2 (e.g., an oxide, such as silicon oxide from a TEOS source) may be formed over the stack 120 and filling the front side openings 81.

The fabrication method may continue as shown in FIGS. 5M-5P, described above. For example, the stack 120 may be etched to form a back side opening 84 as shown in FIG. 5M. Portions of the second material layers 121 may be removed through the back side opening 84 to form back side recesses 539 between the first material layers 19, as shown in FIG. 5N. The blocking dielectric 7 may function as an etch stop such that the convex-curved surfaces 609 of the blocking dielectric 7 (see FIG. 6D) may be exposed in the back side recesses 539. Control gates 3 may be formed in the back side recesses through the back side opening, as shown in FIG. 5O. The control gates 3 may be formed adjacent to the convexly-rounded exterior surfaces 609 of the clam shaped portions 611 of the blocking dielectric 7 (i.e., such that the side surfaces of the control gates 3 adjacent to the blocking dielectric 7 have a concave-shaped profile).

Figure 7A:
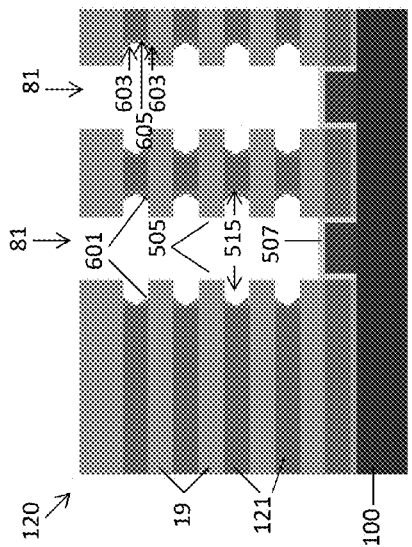
FIGS. 7A-7C are side cross sectional views illustrating a method of making a NAND string memory device according to yet another embodiment.
Figure 7B:
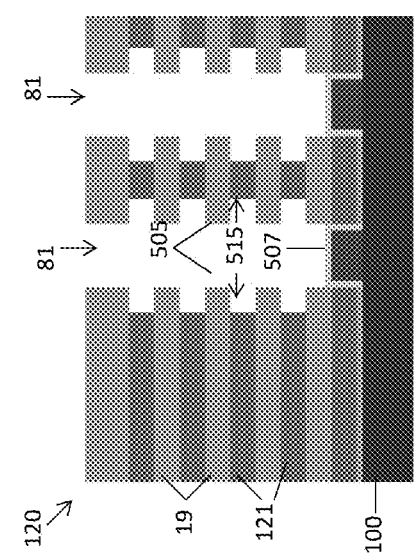
Figure 7C:
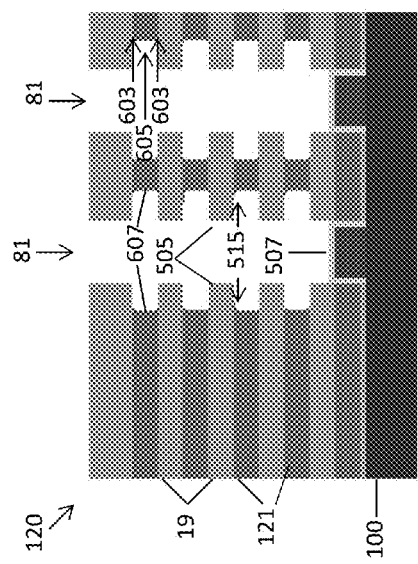

FIGS. 7A-7C illustrate an alternative embodiment in which the first material layers 19 comprise an oxide material (e.g., silicon oxide) and the second material layers 121 comprise a semiconductor material (e.g., polysilicon) forming an OPOP stack 120. FIGS. 7A-7C substantially correspond to FIGS. 6A-6C described above, and illustrate the formation of the front side recesses 515 by selectively etching the layers 121 of second material relative to the first material using a first etching process (FIG. 7A), oxidizing the surfaces of the layers 121 of the second material exposed within the front side recesses 515 to form oxidized surfaces 601 (FIG. 7B), and etching the oxidized surfaces 601 of the second material layers 121 using a second etching process to form concaved-shaped surfaces 607 of the layers 121 within the recessed portions 515. The method of FIGS. 7A-7C may differ from the method of FIGS. 6A-6C in that the oxidized surfaces 601 in FIG. 7B may comprise silicon oxide rather than silicon oxynitride as described above. The oxidized surfaces 601 may be formed using a batch isotropic oxidation process, and the oxidation may be performed under substantially identical parameters as discussed above with respect to FIGS. 6A-6C. In the embodiment of FIGS. 7A-7C, the second etching process may have a higher etch rate for the material of the second material layers 121 (e.g., polysilicon) than for the oxide material (e.g., silicon oxide) of the oxidized surfaces 601.

A fourth embodiment method of making a NAND string 150 that includes surface nitridation and etching of the first material layers 19 to provide convexly-rounded corner portions is illustrated in FIGS. 8A-8G. The method of FIGS. 8A-8G may be used as an alternative to or in addition to any of the steps of illustrated in FIGS. 5A-7C. FIG. 8A corresponds to FIG. 5E, and shows the stack 120 after etching the stack to form the front side openings 81 and removing portions of the second material layers 121 through the front side openings 81 to form front side recesses 515 between the first material layers 19. In this embodiment, the first material layers 19 comprise an oxide material (e.g., silicon oxide) and the second material layers 121 comprise a nitride material (e.g., silicon nitride), forming an ONON stack 120. Alternatively, the second material layers 121 may comprise a semiconductor material (e.g., polysilicon) forming an OPOP stack 120.

Referring to FIG. 8B, the surfaces of the first oxide layers 19 are nitrided to form oxynitride regions 801 over the portions of the layers 19 exposed on the sidewall 505 of the front side opening 81 and the portions of the layers 19 exposed by the front side recesses 515. In embodiments, the surface nitridation may be performed using a slot plane antenna (SPA) plasma source.

Referring to FIG. 8C, the stack 120 may be etched through the front side openings 81 to selectively remove at least a portion of the oxynitride regions 801 from the first oxide layers 19 to provide convexly-rounded corner portions 803 extending between the front side recesses 515 and the sidewall 505 of the front side opening 81. In embodiments, the etching may use an etchant that selectively etches the oxynitride material of regions 801 relative to the oxide material of layers 19.

Referring to FIG. 8D, a blocking dielectric 7 such as described above may be formed over the sidewall 505 of the front side opening 81 and the convexly-rounded corner portions 803 of layers 19 and within the front side recesses 515. The blocking dielectric 7 may include a plurality of rounded edge portions 805 over each of the convexly-rounded corner portions 803. The rounded edge portions 805 of the blocking dielectric 7 may help reduce leakage current in the finished NAND strings. The blocking dielectric 7 may also be formed over the bottom surface 507 of the front side opening 81.

Referring to FIG. 8E, a charge storage material such as described above may be formed over the blocking dielectric 7 within the memory openings 81 and may be recessed by a directional dry etch process to provide a plurality of vertically spaced apart charge storage regions 9 located within the front side recesses 515. In embodiments, the charge storage regions 9 may comprise a semiconductor material (e.g., polysilicon). The blocking dielectric 7 may include a plurality of clam-shaped portions 611 that surround the charge storage regions 9 on the top 554, bottom 556 and first side surfaces 555 of each of the charge storage regions 9. The second side surface 557 of the charge storage regions 9 may face the front side opening 81 and may define a portion of the sidewall 505 of the front side opening 81. The blocking dielectric 7 in this embodiment also includes substantially straight segments 619 extending over the sidewall 505 of the front side opening 81 generally perpendicular to the major surface 100a of the substrate 100 between the respective clam shaped portions 611. Each of the rounded edge portions 805 of the blocking dielectric 7 may extend between a straight segment 619 and a clam-shaped portion 611 of the blocking dielectric 7.

Referring again to FIG. 8E, a plurality of self-aligned tunnel dielectric layers 11 may be formed adjacent to the second side surface 557 of each of the charge storage regions 9 by oxidizing the second side surface 557 of the charge storage region 9 exposed in the front side opening 81. In one embodiment, the charge storage regions 9 comprise polysilicon, and the second side surfaces 557 are oxidized to form silicon oxide layers 11 using a batch isotropic oxidation process. The self-aligned tunnel dielectric layers 11 may be separated from one another along the sidewall 505 of the front side opening 81 by the straight segments 619 of the blocking dielectric 7.

While the selective oxidation of the floating gate charge storage regions 9 to form vertically spaced apart tunnel dielectric layers (e.g., segments) 11 is described above in combination with a corner rounding step, it should be understood that the tunnel dielectric layers 11 may be formed as described above in a process which includes or excludes the corner rounding and/or the metal induced crystallization steps described above.

Referring to FIG. 8F, a semiconductor cover layer 525 (e.g., a polysilicon or amorphous silicon layer) may be formed over the stack 120, including over the blocking dielectric 7 and the vertically-spaced apart tunnel dielectric layers 11 on the sidewall 505 of each of the front side openings 81, and may also be formed over the blocking dielectric 7 on the bottom surface 507 of the front side openings 81 (not shown in FIG. 8F).

An anisotropic etching process (e.g., a reactive ion etch (RIE) process) may be used to remove the semiconductor cover layer 525, the blocking dielectric 7, and the cover layer 514 from over the bottom surfaces 507 of the front side openings 81 to expose the protrusions 511 (or substrate 100 if protrusions 511 are omitted) at the bottom surfaces 507 of the front side openings 81. The semiconductor cover layer 525 may protect the tunnel dielectric layers 11, the blocking dielectric 7 and the charge storage regions 9 on the sidewalls 505 of the front side memory openings 81 from etching damage.

Referring to FIG. 8G, a semiconductor material channel layer 527 (e.g. a polysilicon or amorphous silicon layer) is formed over the stack 120 including over the semiconductor cover layer 525 along the sidewall 505 of each of the front side openings 81 and over the exposed protrusion 511 (or substrate 100 if protrusions 511 are omitted) on the bottom surface 507 of each of the front side openings 81. The semiconductor material channel layer 527 may contact the semiconductor cover layer 525 within each of the front side openings 81 and together the layers 525, 527 may form a vertically oriented semiconductor channel 1 as described above with reference to FIGS. 1A-2B and 3B.

Referring again to FIG. 8G, layers 527, 525 and 7 may be removed from the top surface 510 of the stack 120 (e.g., via etching and/or chemical mechanical polishing (CMP)), and an insulating fill material 2 (e.g., an oxide, such as silicon oxide from a TEOS source) may be formed over the stack 120 and filling the front side openings 81. The fabrication method may continue as shown in FIGS. 5M-5P, described above.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic three dimensional NAND string, comprising:
    forming a stack of alternating layers of a first material and a second material different than the first material over a substrate;
    etching the stack to form a front side opening in the stack having a sidewall defined at least partially by the alternating layers of the first material and the second material;
    removing a first portion of the second material layers through the front side opening to form front side recesses between the first material layers;
    forming an amorphous or polycrystalline semiconductor material over at least a portion of the sidewall of the front side opening and within the front side recesses;
    forming a layer of a metal material over at least a portion of the sidewall of the front side opening and adjacent to the amorphous or polycrystalline semiconductor material within the front side recesses;
    annealing the metal material and the amorphous or polycrystalline semiconductor material within the front side recesses to form a large grain polycrystalline or single crystal semiconductor material charge storage region within each of the front side recesses by a metal induced crystallization process, wherein following the metal induced crystallization process at least a portion of the metal material is located between the charge storage regions and the second material layers;
    forming a tunnel dielectric layer over the charge storage regions in the front side opening; and
    forming a semiconductor channel over the tunnel dielectric layer in the front side opening.

2. The method of claim 1, wherein:
    forming the amorphous or polycrystalline semiconductor material comprises forming amorphous silicon or polysilicon;
    forming the layer of a metal material comprises depositing nickel using chemical vapor deposition (CVD); and
    forming the large grain polycrystalline or single crystal semiconductor material charge storage regions comprises forming large grain polysilicon or single crystal silicon charge storage regions.

3. The method of claim 2, further comprising:
    removing native oxides from a surface of the amorphous or polycrystalline semiconductor material over at least a portion of the sidewall of the front side opening prior to forming the layer of metal material; and
    performing a rapid thermal annealing process to promote diffusion of the nickel into the amorphous or polycrystalline semiconductor material.

4. The method of claim 3, further comprising:
    oxidizing the layer of metal material to form a nickel oxide material over at least a portion of the sidewall of the front side opening; and
    following the metal induced crystallization process, etching through the front side opening to remove the nickel oxide material from the sidewall of the front side opening.

5. The method of claim 4, wherein the nickel oxide is etched using a sulfuric acid and hydrogen peroxide etch.

6. The method of claim 1, further comprising:
    etching the stack to form a back side opening in the stack;
    removing by etching at least a second portion of the second material layers through the back side opening to form back side recesses between the first material layers using the portions of the metal material as an etch stop;
    forming a blocking dielectric in the back side recesses through the back side opening; and
    forming control gates over the blocking dielectric in the back side recesses through the back side opening.

7. The method of claim 6, further comprising:
    etching the back side recesses through the back side opening to remove the portions of the metal material from the back side recesses prior to forming the blocking dielectric in the back side recesses.

8. The method of claim 6, wherein forming the control gates comprises:
    forming an amorphous or polycrystalline semiconductor material over at least a portion of a sidewall of the back side opening and within the back side recesses;
    forming a layer of a metal material over at least a portion of the sidewall of the back side opening and adjacent to the amorphous or polycrystalline semiconductor material within the back side recesses; and annealing the metal material and the amorphous or polycrystalline semiconductor material within the back side recesses to form a large grain polycrystalline or single crystal semiconductor material control gates within each of the back side recesses by a metal induced crystallization process, wherein following the metal induced crystallization process at least a portion of the metal material is located between the control gates and the charge storage regions.

9. The method of claim 6, wherein the control gates comprise at least one of a metal, a metal alloy, a metal nitride and a metal silicide material.

10. The method of claim 6, further comprising:
forming a layer of an insulating material over at least one sidewall of the back side opening; and
forming an electrically conductive material within the back side opening such that the insulating material electrically insulates the electrically conductive material from the control gates.

11. The method of claim 10, wherein the electrically conductive material is formed in electrical contact with at least one of a doped well region and a doped source region of the substrate at the bottom of the back side opening.

12. The method of claim 1, wherein the first material layers comprise an electrically insulating material and wherein the second material layers comprise a sacrificial material.

13. The method of claim 12, wherein the first material layers comprise silicon oxide and the second material layers comprise at least one of silicon nitride and polysilicon.

14. The method of claim 1, wherein each of the front side recesses are formed having a first side adjacent to the front side opening and a second side opposite the first side defined by a concave-shaped surface of a second material layer.

15. The method of claim 1, further comprising forming convexly-rounded corner portions on the first material layers adjacent to the front side opening.

16. The method of claim 1, further comprising forming one of a source or drain electrode which contacts the semiconductor channel from above, and another one of a source or drain electrode which contacts the semiconductor channel below the stack to form the monolithic three dimensional NAND string.

17. The method of claim 1, wherein:

the semiconductor channel has a U-shaped side cross section;

two wing portions of the U-shaped semiconductor channel extend substantially perpendicular to a major surface of the substrate are connected by a connecting portion which extends substantially parallel to the major surface of the substrate;

one of a source or drain electrode contacts the first wing portion of the semiconductor channel from above; and another one of a source or drain electrode contacts the second wing portion of the semiconductor channel from above.

* * * * *